United States Patent [19]

Akiba et al.

[11] Patent Number: 4,796,274
[45] Date of Patent: Jan. 3, 1989

[54] SEMICONDUCTOR DEVICE WITH DISTRIBUTED BRAGG REFLECTOR

[75] Inventors: Shigeyuki Akiba; Masashi Usami; Yukio Noda; Masatoshi Suzuki, all of Tokyo, Japan

[73] Assignee: Kokusai Denshin Denwa Kabushiki Kaisha, Tokyo, Japan

[21] Appl. No.: 13,665

[22] Filed: Feb. 12, 1987

[30] Foreign Application Priority Data

Feb. 17, 1986 [JP] Japan .................................. 61-30986

[51] Int. Cl.$^4$ .............................................. H01S 3/19
[52] U.S. Cl. .................................. 372/96; 350/96.12; 350/96.14
[58] Field of Search ............... 372/96, 44, 45; 357/61; 350/96.1, 96.12, 96.13, 96.14

[56] References Cited

FOREIGN PATENT DOCUMENTS 0158989 9/1983 Japan ....................................... 372/96

Primary Examiner—James W. Davie
Attorney, Agent, or Firm—Emmanuel J. Lobato; Robert E. Burns

[57] ABSTRACT

A semiconductor device with a distributed Bragg reflector is disclosed, in which periodic corrugations are formed between two semiconductor layers along the direction of travel of light. In accordance with the present invention, the periodic corrugations are formed by grid-like layers of a refractory material. The refractory material is an insulator, a refractory metal or a laminate member of an insulator and a refractory metal.

11 Claims, 2 Drawing Sheets

SEMICONDUCTOR DEVICE WITH DISTRIBUTED BRAGG REFLECTOR

BACKGROUND OF THE INVENTION

The present invention relates to a semiconductor device provided with a distributed Bragg reflector, and more particularly to improvement in or relating to periodic corrugations for use in the Bragg reflector.

Since a distributed Bragg reflector (hereinafter referred to simply as a "DBR") selectively reflects and transmits light of particular wavelengths, its use is extending to an optical filter and a DFB laser and a DBR laser, which oscillate at a single wavelength.

However, it has been difficult to obtain, with good reproducibility, periodic corrugations for use in the DBR.

SUMMARY OF THE INVENTION

An object of the present invention is to provide a semiconductor device which has a distributed Bragg reflector which permits the formation of the periodic corrugations with good reproducibility, so as to overcome the above-mentioned defect of the prior art DBR structure.

To attain the above object of the present invention, a semiconductor device with a distributed Bragg reflector is provided, in which periodic corrugations are formed between two semiconductor layers along the direction of travel of light, characterized in that the periodic corrugations are formed by grid-like layers of a refractory material. The refractory material may be an insulator, a refractory metal, or a laminate member of an insulator and a refractory metal.

BRIEF DESCRIPTION OF THE DRAWING

The present invention will described in detail below in comparison with the accompanying drawing, in which.

BRIEF DESCRIPTION

To make differences between prior art and the present invention clear, an example of the prior art will first be described.

Figure 1:
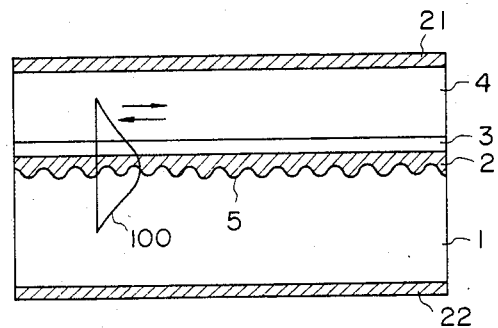
FIG. 1 is a schematic diagram of a conventional DBR.

FIG. 1 shows a prior art example of a semiconductor DBR. For instance, an n-type InGaAsP layer 2, an n-type InGaAsP layer 3, and a p-type InP layer 4 are laminated on an n-type InP substrate 1, and the film thickness of the n-type InGaAsP layer 2 is varied periodically to form a diffraction grating 5, thus producing periodic variations in the refractive index for light 100. Reference numerals 21 and 22 indicate electrodes. By virtue of such periodic variations in the refractive index, light is selectively reflected at the Bragg wavelength which is dependent upon the period of the refractive index variations and the refractive index of the semiconductor used, obtaining the function of an optical filter element. Further, in case of the n-type InGaAsP layer 2 is used as a waveguide layer and the n-type InGaAsP layer 3 as a light emitting layer, the DBR functions as a DFB laser. Thus, by materializing such a DBR as shown in FIG. 1 with excellent reproducibility, semiconductor elements of various functions can be obtained.

In case of fabricating such a DBR as depicted in FIG. 1 through a crystal growth process, the diffraction grating 5 is provided on the surface of the n-type InP substrate 1 in advance and the overlying layers are epitaxially grown thereon one after another. In this instance, however, since the surface of the n-type InP substrate 1 is exposed to a high temperature, the substrate surface is flattened by a mass-transport phenomenon, introducing the problem that the diffraction grating 5 disappears or the corrugations are markedly reduced in height or depth. On the other hand, it has been proposed that the entire InGaAsP layer 2 having the periodic corrugations is formed of an insulator or metal, instead of using a semiconductor layer, and is used simply as a filter element. The periodic corrugations of the filter element formed of an insulator or metal can be fabricated with excellent reproducibility. However, even if this filter element is utilized as a substitute for the InGaAsP layer 2 in FIG. 1, the crystal growth between the InP substrate 1 and the InGaAsP layer 3 is cut off, and in addition it is impossible to achieve the operation of an optical semiconductor active element such as a DFB laser or optical modulator.

Accordingly, it has been difficult to obtain, with good reproducibility, periodic corrugations for use in the DBR.

The present invention has its feature in including, as a constituent of the DBR, one layer of refractory material, for example, an insulator or metal layer, or a laminate member composed of an insulator and a metal layer, which is periodically embedded, in a semiconductor layer, in a grid-shape in the direction of travel of light.

Figure 2:
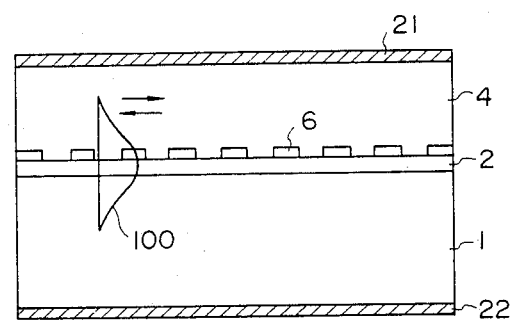
FIG. 2 is a schematic sectional view of the DBR according to the present invention.
Figure 3:
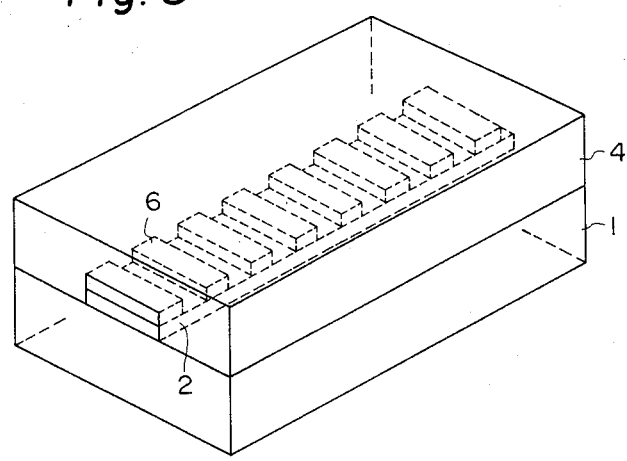
FIG. 3 is a perspective view of the DBR according to the present invention.

With reference to the accompanying drawings, the present invention will hereinafter be described in detail. FIG. 2 is a schematic sectional view of a DBR according to an embodiment of the present invention, and FIG. 3 is its perspective view, with electrodes 21 and 22 taken away. In FIG. 2, the n-type InGaAsP layer 2 laminated on the InP substrate 1 serves as a waveguide, and an insulator 6 such as silicon oxide, silicon nitride, or aluminum oxide, which is periodically deposited in the form of a grid-shape on the InGaAsP layer 2, is embedded in the InP layer 4. The width of the grid-shape DBR viewed perpendicularly to the travelling direction of the light 100 occupies a small part of the substrate 1 as shown in FIG. 3. Since the refractive index of the insulator 6 is far smaller than the refractive indexes of the semiconductor layers 1, 2 and 4, its refractive index for the light 100 periodically varies in the direction of its travel; so that the insulator 6 forms the DBR and operates as an optical filter. By applying an electric field to the n-type InGaAsP layer 2 across the electrodes 21 and 22, its refractive index is varied by an electro-optic effect, and so the reflection wavelength of the filter can be controlled. Such a structure is obtainable by depositing the insulator 6 all over the surface of the n-type InGaAsP layer 2 after growing it, and forming the insulator layer into such a grid like form as shown, through utilization of two-beam interference exposure, photoresist and etching techniques, followed by crystal growth of the p-type InP layer 4. During the crystal growth of the p-type InP layer 4 the grid-like insulator 6 is also exposed to high temperatures, but it is stable at crystal growth temperatures (between 550° to 700° C., for instance), and hence is free from the fear of deformation. Moreover, the crystal growth is initiated on those surface areas of the n-type InAaAsP layer 2 and the substrate which are not covered with the insulator 6, and crystals grow in a manner to embed therein the insulator 6; therefore, the p-type InP layer 4 can be obtained as an expitaxial layer.

EXAMPLE 1

Figure 4:
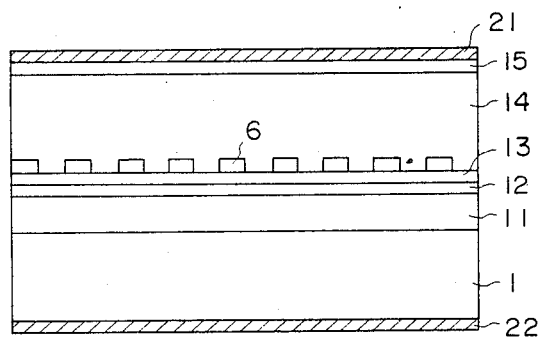
FIG. 4 is a schematic diagram of a DFB laser for illustrating a first example of application of the present invention.

FIG. 4 is a first example of application of the present invention, schematically showing a DFB laser. An n-type InP layer 11, an InGaAsP active layer 12, and a p-type InGaAsP buffer layer 13 are laminated on the n-type InP substrate 1 and the grid-shaped insulator 6 is formed on the buffer layer 13, as described above, after which a p-type InP layer 14 and a p-type InGaAsP cap layer 15 are grown. A current is injected into the active layer 13 across the electrodes 21 and 22, but since no current flows through the insulator 6, periodic variations in gain as well as in refractive index are produced, ensuring extremely stable single-wave oscillation.

EXAMPLE 2

Figure 5:
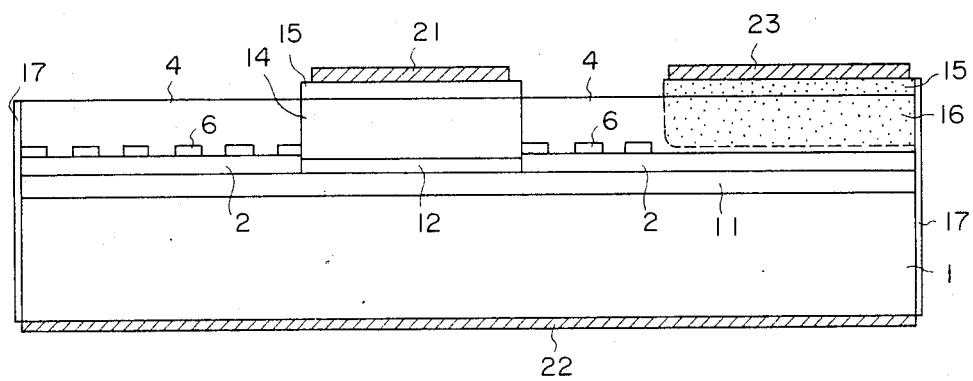
FIG. 5 is a schematic diagram of a DBR laser with an external modulating region integrated therein for illustrating a second example of application of the present invention.

FIG. 5 is a second example of application of the present invention, schematically showing DBR laser, in which an external modulating region is integrated. In the following, the parts corresponding to those in FIGS. 2 and 4 will be identified by the same reference numerals and will not be described, for the sake of brevity. In FIG. 5, a DBR similar to that in FIG. 2 is formed on either side of the InGaAsP active layer 12, which will ultimately serve as a gain region, and a current is injected into the InGaAsP active layer 12 across the electrodes 21 and 22, thereby constituting a DBR laser.

On the other hand, a reverse bias voltage is applied across the electrodes 23 and 22 to a pn junction formed by a zinc-diffused region 16, and the energy gap of the n-type InGaAsP layer 2 is selected around 50 meV larger than the energy gap of the InGaAsP active layer 12. This gives rise to light absorption by the Franz-Keldysh effect, permitting modulation of the output of the DBR laser. Reference numeral 17 designates an antireflection coating. In case of monolithically integrating a plurality of functional elements as in this embodiment, it is very important to materialize the DBR, as designed, with a high degree of reproducibility. As referred to above, the insulator 6 undergoes substantially no change in shape during the crystal growth, and hence is of particular importance for materializing such a high performance optical semiconductor element.

While in the above the grid-like insulator layer 6 is included as the constituent feature of the distributed Bragg reflector, the same effects as those mentioned above could also be produced by employing a refractory material which is stable at high temperatures during the crystal growth, for example, a refractory metal such as tungsten, titanium, or the like. When employing tungsten or like metal instead of the insulator 6 in the embodiment of FIG. 5, in particular, it constitutes a great loss to the TM mode formed by an electric field perpendicular to a junction, with the result that the TM mode is suppressed almost completely, making it possible to obtain a stable TE mode oscillation which is formed by an electric field parallel to the junction.

Furthermore, a laminate member which is stable at high temperatures could be obtained by laminating at least once layers of an insulator and a refractory metal in combination. Such a laminate member comprising the insulator and refractory metal layers in combination is of particular utility when employed in an element into which a current can be flowed in the manner mentioned previously with regard to FIG. 4. That is, when the insulator 6 is merely substituted by a refractory metal, the latter makes difficult the formation of a pn junction in the vicinity of a boundary between the InGaAsP active layer 12 and the p-type InGaAsP buffer layer 13, but the use of a laminate member including a refractory metal layer sandwiched between insulator layers will solve this problem. In this instance, the metal layer sandwiched between the insulator layers contributes to the suppression of the afore-mentioned TM mode, permitting stable TE mode oscillation.

Although in the above no particular mention is made of a stripe structure for stabilizing the transverse mode, the present invention is applicable to various stripe structures such as a buried stripe structure shown in FIG. 3, a plano-convex waveguide structure, etc. and is applicable to semiconductor materials not only of the InGaAsP/InP series but also of the InAlGaAs/InP series, the AlGaAs/GaAs series, and so forth.

EFFECT OF THE INVENTION

As described above in detail, according to the optical semiconductor element of the present invention, since the periodic corrugations of the distributed Bragg reflector having wavelength selectivity are formed by a grid-shaped refractory metal, for example, an insulator or refractory metal or a laminate member of an insulator and a metal, the periodic corrugations can be fabricated with extremely excellent reproducibility. Accordingly, it is possible to realize, as designed, an optical filter, a DFB laser, a DBR laser, or such an optical integrated element as depicted in FIG. 5. These optical semiconductor elements can be used widely for optical communications, optical data processing, and optical switching, and hence are of great utility.

What we claim is:

1. A semiconductor device comprising, a substrate, two semiconductor layers on the substrate including a light waveguide layer, a distributed Bragg reflector comprising a diffraction grating having periodic corrugations between the two semiconductor layers along a direction of travel of light in the active light waveguide layer, said periodic corrugations comprising grid-like layers of a refractory material having a small width thereof viewed perpendicularly to the direction of travel of light in comparison with that of the substrate, and electrodes for applying an electric field to the waveguide layer.

2. A semiconductor device according to claim 1, in which said grid-like layers are embedded in one of the two semiconductor layers.

3. A semiconductor device according to claim 2, in which said one of the two semiconductor layers is a layer other than said active light waveguide layer.

4. A semiconductor device according to claim 3, in which said other layer is an expitaxial layer.

5. A semiconductor device according to claim 3, in which the refractive index of the corrugations is smaller than the refractive indexes of the semiconductor layers.

6. A semiconductor device according to claim 5, in which the refractive index of the corrugations periodically varies in the direction of travel of light effectively, whereby the distributed Bragg reflector functions as an optical filter.

7. A semiconductor device according to claim 6, including means for varying the refractive index of the active light waveguide layer by electro-optic effect to control the reflection wavelength of the filter, and the last-mentioned means comprising the electrodes for applying an electric field to the active light waveguide layer.

8. A semiconductor device according to claim 1, in which said refractory material is an insulator.

9. A semiconductor device according to claim 1, in which said refractory material is a refractory metal.

10. A semiconductor device according to claim 1, in which said refractory material is a laminate of an insulator and a refractory metal.

11. A distributed feedback laser comprising, a substrate, an n-type semiconductor layer on the substrate, a semiconductor active layer transmitting light and a p-type semiconductor buffer layer on the n-type semiconductor layer, a diffraction grating having grid-shaped corrugations along a direction of travel of light in the active layer disposed on the buffer layer and made of an insulator refractory material, a p-type semiconductor layer on the corrugations and a p-type semiconductor cap layer, and electrodes for injecting a current into the active layer for developing periodic variations in gain and periodic variations in the refractive index of the active layer ensuring stable single wave oscillation.

* * * * *